United States Patent
Chong et al.

(10) Patent No.: US 7,671,579 B1
(45) Date of Patent: Mar. 2, 2010

(54) METHOD AND APPARATUS FOR QUANTIFYING AND MINIMIZING SKEW BETWEEN SIGNALS

(75) Inventors: Yan Chong, San Jose, CA (US); Joseph Huang, Morgan Hill, CA (US); Chiakang Sung, Milpitas, CA (US); Eric Choong-Yin Chang, Cupertino, CA (US); Peter Boyle, Mountain View, CA (US); Adam J. Wright, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 291 days.

(21) Appl. No.: 11/470,898

(22) Filed: Sep. 7, 2006

Related U.S. Application Data (60) Provisional application No. 60/781,140, filed on Mar. 9, 2006.

(51) Int. Cl.
  *G01R 23/175* (2006.01)
  *G08B 23/00* (2006.01)
(52) U.S. Cl. .................. 324/76.54; 324/76.35; 340/527
(58) Field of Classification Search ............... 324/76.54
  See application file for complete search history.

(56) References Cited

U.S. PATENT DOCUMENTS

| | | | | |
|---|---|---|---|---|
| 5,959,568 A | * | 9/1999 | Woolley | 342/42 |
| 6,486,651 B1 | * | 11/2002 | Lee et al. | 324/76.53 |
| 6,754,613 B2 | * | 6/2004 | Tabatabaei et al. | 702/189 |
| 6,850,051 B2 | * | 2/2005 | Roberts et al. | 324/76.54 |
| 7,391,246 B1 | * | 6/2008 | Lu | 327/161 |
| 2003/0154043 A1 | * | 8/2003 | Singh | 702/79 |
| 2005/0184739 A1 | * | 8/2005 | Lin | 324/601 |

\* cited by examiner

*Primary Examiner*—Jeff Natalini
(74) *Attorney, Agent, or Firm*—Martine Pennilla & Gencarella, LLP.

(57) ABSTRACT

Delay associated with each of two signals along respective transmission paths is accurately measured using a delay measurement circuit that is fabricated in situ on the actual device where the circuitry for propagating the two signals is fabricated. Thus, the measured delay associated with each of the two signals is subject to the same fabrication-dependent attributes that affect the actual circuitry through which the two signals will be propagated during operation of the device. The skew between the two signals is quantified as the difference in the measured delays. Coarse and fine delay modules are defined within the transmission path of each of the two signals. Based on the measured skew between the two signals, the coarse and fine delay modules are appropriately set to compensate for the skew. The appropriately settings for the coarse and fine delay modules can be stored in non-volatile memory elements.

20 Claims, 11 Drawing Sheets

METHOD AND APPARATUS FOR QUANTIFYING AND MINIMIZING SKEW BETWEEN SIGNALS

CROSS REFERENCE TO RELATED APPLICATIONS

This application claims priority from U.S. Provisional Patent Application No. 60/781,140, filed Mar. 9, 2006, and entitled "Trimming Scheme for External Memory Interface Applications Using Non-Volatile Elements in FPGA Devices." This provisional application is herein incorporated by reference.

BACKGROUND

A double data rate (DDR) memory controller can be implemented in a field programmable gate array (FPGA) device. As the DDR memory is advanced to provide higher data throughput, e.g., up to 1 Gbs, a timing budget left for the FPGA is substantially reduced. The DDR memory interface is defined to transmit a data strobe signal in conjunction with a group of data signals for data capture in the receiver side, i.e., at the memory controller of the FPGA. All skew and jitter among the various data signals and the data strobe signal is treated as uncertainty and is subtracted from the valid data sampling window. Thus, uncertainty associated with signal skew limits the rate at which the memory controller can process incoming and outgoing data transmissions. Therefore, it is desirable to reduce skew among the data signals and data strobe signal. In view of the foregoing, a solution is needed to accurately quantify skew between signals and accurately compensate for the quantified skew to enhance device performance.

SUMMARY

In one embodiment, a signal delay measurement circuit is disclosed. The circuit includes an input register defined to receive a test data signal. The input register is defined to output the test data signal in accordance with a test clock signal. The circuit also includes an output register defined to receive a delayed version of the test data signal. The output register is defined to output the delayed version of the test data signal in accordance with a delayed version of the test clock signal. The circuit further includes an emulation module connected between the input register and the output register. The emulation module is defined to emulate an actual signal transmission path for which signal delay is to be measured. The emulation module is defined to introduce signal delay in the test data signal as the test data signal is transmitted from the input register to arrive at the output register as the delayed version of the test data signal. The circuit also includes a delay chain defined to introduce a controllable amount of signal delay in the test clock signal so as to generate the delayed version of the test clock signal.

In another embodiment, a delay element calibration circuit is disclosed. The circuit includes an input register defined to receive a test data signal. The input register is defined to output the test data signal in accordance with a test clock signal. A period of the test clock signal is adjustable. The circuit also includes an output register defined to receive a delayed version of the test data signal. The output register is defined to output the delayed version of the test data signal in accordance with the test clock signal, i.e., in accordance with the same test clock signal by which the input register is clocked. The circuit further includes a chain of delay elements connected between the input register and the output register. The chain of delay elements is defined to introduce signal delay in the test data signal as the test data signal is transmitted from the input register to arrive at the output register as the delayed version of the test data signal.

In another embodiment, a method is disclosed for minimizing skew between two signals. The method includes operations for calibrating each of a coarse delay element and a fine delay element. The method also includes operations for measuring signal delay associated with each of a first signal and a second signal. The signal delay measurement operations are performed using the calibrated coarse and fine delay elements. The method further includes an operation for determining a skew between the first and second signals. The skew is defined as a difference between the measured signal delay associated with the first signal and the measured signal delay associated with the second signal. In another operation, settings for coarse and fine delay modules are determined so as to minimize the skew between the first and second signals. The coarse and fine delay modules are defined to implement a selectable number of the coarse and fine delay elements, respectively. The method also includes an operation for storing the determined settings for the coarse and fine delay modules in non-volatile memory.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A method and apparatus is disclosed for quantifying and minimizing skew between two signals, e.g., between a data signal and a data strobe signal. The delay associated with each of the two signals is accurately measured. Also, measurement of the delay associated with each of the two signals is performed using a delay measurement circuit that is fabricated in situ on the actual device where the circuitry for propagating the two signals is fabricated. The delay measurement circuit is defined to emulate a delay associated with each of the two signals as propagated from a respective origin point to a respective destination point. Thus, the measured delay associated with each of the two signals is subject to the same fabrication-dependent attributes that affect the actual circuitry through which the two signals will be propagated during operation of the device. Consequently, each measured delay for the two signals represents a true delay that is specific to the particular as-fabricated condition of the device. Once the delay for each of the two signals is measured using the delay measurement circuit, the skew between the two signals is quantified as the difference in the measured delays.

A coarse delay module and fine delay module are defined within the transmission path of each of the two signals. The transmission path represents the circuitry through which a given signal will be propagated from its origin point to its destination point. Based on the measured skew between the two signals, the coarse and fine delay modules associated with each of the two signals are appropriately set to compensate for the skew, i.e., minimize the skew, between the two signals. The accuracy by which the skew can be compensated is dependent upon the accuracy of the coarse and fine delay modules.

The coarse delay module provides for serial connection of a selectable number of coarse delay elements, wherein each coarse delay element is defined to provide a substantially equivalent amount of signal delay. The signal to be propagated through the coarse delay module is transmitted through the selected number of serially connected coarse delay elements within the coarse delay module. Similarly, the fine delay module provides for serial connection of a selectable number of fine delay elements, wherein each fine delay element is defined to provide a substantially equivalent amount of signal delay. The signal to be propagated through the fine delay module is transmitted through the selected number of serially connected fine delay elements within the fine delay module. Thus, the accuracy by which the delay of a given signal can be adjusted by the coarse and fine delay modules is defined by the accuracy of the coarse and fine delay elements, respectively.

To enable selection of the appropriate number of coarse and fine delay elements to be serially connected within the coarse and fine delay modules, respectively, in order to accurately compensate for the skew between the two signals, it is necessary to calibrate the coarse and fine delay elements. Calibration of the coarse and fine delay elements essentially includes determination the amount of signal delay provided by the coarse and fine delay elements, respectively, within the actual device. The signal delay provided by the coarse delay element is measured using a coarse delay calibration circuit that is fabricated in situ on the actual device where the circuitry for propagating the two signals is fabricated. Similarly, the delay provided by the fine delay element is measured using a fine delay calibration circuit that is fabricated in situ on the actual device where the circuitry for propagating the two signals is fabricated.

Thus, the measured delay associated with each of the coarse and fine delay elements is subject to the same fabrication-dependent attributes that affect the actual circuitry having the coarse and fine delay modules defined therein. Consequently, each measured amount of signal delay provided by the coarse and fine delay elements represents a true signal delay that is specific to the particular as-fabricated condition of the device. Once the coarse and fine delay elements are calibrated, it is possible to select the appropriate number of coarse and fine delay elements to be serially connected within the coarse and fine delay modules, respectively, within each of the two signal paths in order to accurately compensate for the skew between the two signals.

By way of example, the method and apparatus for quantifying and minimizing skew between two signals is described herein in the context of a memory interface performing a read operation. It should be understood, however, that the present invention is not limited to a memory interface performing a read operation or to a memory interface for that matter. It should be appreciated that the method and apparatus for quantifying and minimizing skew between two signals, as described herein, can be implemented in essentially any integrated circuit device where quantification of signal delay is necessary and/or where minimization of skew between two or more signals is desired. Additionally, the present invention may be of particular benefit in cases where signal delay measurement, skew quantification, and/or skew minimization are desired to be performed with substantial accuracy on a chip-specific basis, thus accounting for chip-specific fabrication-dependent attributes that affect signal propagation within the specific chip.

Figure 1A:
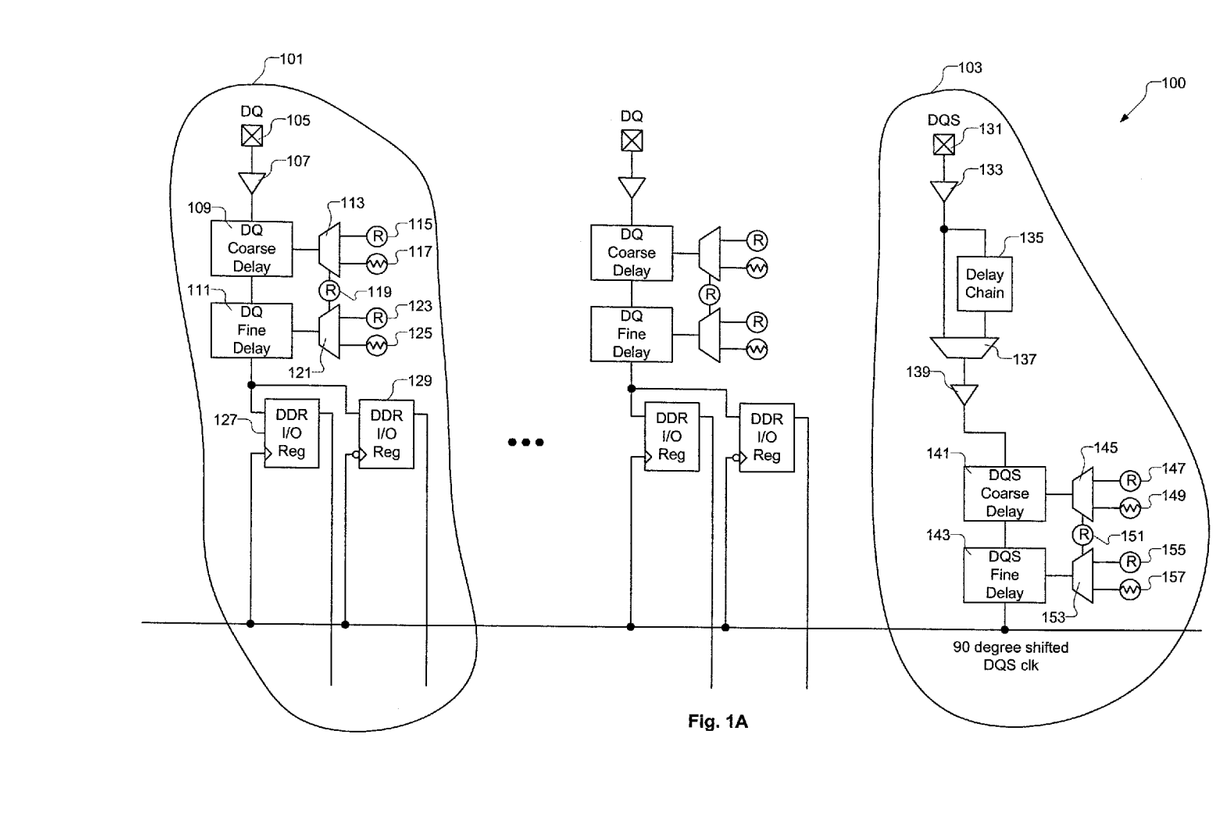
FIG. 1A is an illustration showing a memory interface, in accordance with one embodiment of the present invention.

FIG. 1A is an illustration showing a memory interface 100, in accordance with one embodiment of the present invention. In one embodiment, the memory interface 100 resides in an on-chip memory controller and is defined to interface with an off-chip memory. For example, the memory controller having memory interface 100 associated therewith is defined on a programmable logic device (PLD), such as a field programmable gate array (FPGA) logically programmed to function as a memory controller. Also, by way of example, the off-chip memory may be of the type DDR, QDR, or RLDRAM, among others.

The memory interface 100 includes a number of data signal ports 105 and a data strobe signal port 131. The number of data signal ports 105 can vary depending on the particular embodiment. For example, in a 32-bit memory interface 100 embodiment, there are thirty-two data signal ports 105 and one data strobe signal port 131. It should be appreciated that the present invention does not depend upon the particular size of the memory interface 100, i.e., the number of data signal ports 105 per data strobe signal port 131. Specifically, the present invention is operable with the memory interface 100 having at least one data signal port 105 and at least one data strobe signal port 131. Therefore, to avoid unnecessarily obscuring the present invention, the description hereafter is provided with regard to a single exemplary data signal path 101 and a single exemplary data strobe signal path 103.

From the data signal port 105, the data signal is transmitted through an input buffer 107 to an input of a coarse delay module 109. From an output of the coarse delay module 109, the data signal is transmitted to an input of a fine delay module 111. From an output of the fine delay module 111, the data signal is transmitted to data input ports associated with each of a pair of input/output (I/O) flip-flops 127 and 129. The I/O flip-flops 127 and 129 are connected to be clocked in an opposite manner. Specifically, a clock port of the I/O flip-flop 127 is connected to receive a clock signal, and a clock port of the I/O flip-flop 129 is connected to received an inverted version of the clock signal. In this manner, the memory interface 100 is capable of providing double data rate throughput, such that data signals can be received at the data signal port 105 and clocked through the data signal path 101 in accordance with both rising and falling edges of the clock signal. Each I/O flip-flop 127/129 includes a data output port through which the data signal having been latched within the flip-flop is transmitted to be received and processed by other logic within the device.

The coarse delay module 109 is defined to receive a control signal from a multiplexer 113. The control signal received by the coarse delay module 109 sets the amount of signal delay provided by the coarse delay module 109. More specifically, the control signal received by the coarse delay module 109 sets the number of serially connected coarse delay elements within the coarse delay module 109 through which the data signal is transmitted. The multiplexer 113 is defined to receive two input signals and a select signal. One of the multiplexer 113 input signals is passed through the multiplexer 113 in accordance with the multiplexer 113 select signal to serve as the control signal for the coarse delay module 109. Thus, each of the multiplexer 113 input signals represents the control signal for the coarse delay module 109. The first multiplexer 113 input signal is stored in a configuration memory cell 115 of the PLD. The second multiplexer 113 input signal in stored in a non-volatile memory cell 117. The multiplexer 113 select signal is stored in a configuration memory cell 119 of the PLD. Thus, the configuration memory cell 119 is configured to specify whether the control signal for the coarse delay module 109 is to be provided from the configuration memory cell 115 or from the non-volatile memory cell 117.

The fine delay module 111 is defined to receive a control signal from a multiplexer 121. The control signal received by the fine delay module 111 sets the amount of signal delay provided by the fine delay module 111. More specifically, the control signal received by the fine delay module 111 sets the number of serially connected fine delay elements within the fine delay module 111 through which the data signal is transmitted. The multiplexer 121 is defined to receive two input signals and a select signal. One of the multiplexer 121 input signals is passed through the multiplexer 121 in accordance with the multiplexer 121 select signal to serve as the control signal for the fine delay module 111. Thus, each of the multiplexer 121 input signals represents the control signal for the fine delay module 111. The first multiplexer 121 input signal is stored in a configuration memory cell 123 of the PLD. The second multiplexer 121 input signal in stored in a non-volatile memory cell 125. The multiplexer 121 select signal is stored in the same configuration memory cell 119 as the multiplexer 113 select signal. Thus, the configuration memory cell 119 is configured to specify whether the control signal for the fine delay module 111 is to be provided from the configuration memory cell 123 or from the non-volatile memory cell 125. Because both of the multiplexers 113 and 121 are defined to receive the same select control signal, the control signals for each of the coarse delay module 109 and the fine delay module 111 will both be provided from either configuration memory or non-volatile memory.

If the coarse and fine delay module 109/111 control signals are provided from non-volatile memory 117/125 as opposed to configuration memory 115/123, the control signals for the coarse and fine delay modules 109/111 can be "burned" into the non-volatile memory 117/125 before the PLD is logically programmed. Thus, provision of the option for storing the control signals of the coarse and fine delay modules 109/111 in the non-volatile memory 117/125 enables the amount of delay to be provided by the coarse and fine delay modules 109/111 to be determined based on test results before the PLD is logically programmed. Use of the configuration memory 115/123 requires that the delay settings of the coarse and fine delay modules 109/111 be predicted. However, use of the non-volatile memory 117/125 enables the delay settings of the coarse and fine delay modules 109/111 to be set based on measured skew between the data signal and the data strobe signal within the actual device.

The data signal is clocked into and out of the I/O flip-flops 127/129 in accordance with the data strobe signal received at the data strobe signal port 131 and transmitted through the data strobe signal path 103. From the data strobe signal port 131, the data strobe signal is transmitted through an input buffer 133 to an input of a delay chain 135. In one embodiment, the delay chain 135 is defined as a clock-drift tracking delay chain with variable delay that will track a system clock in order to provide a consistent one-quarter clock period delay, i.e., 90 degree phase-shift delay, in the data strobe signal relative to the received data signal. Thus, the data strobe signal provided at an output of the delay chain 135 is delayed by one-quarter of a clock period relative to the data signal received at the data signal port 105. An exemplary delay chain 135 is described in U.S. Pat. No. 7,030,675, which is incorporated herein by reference.

Figure 1B:
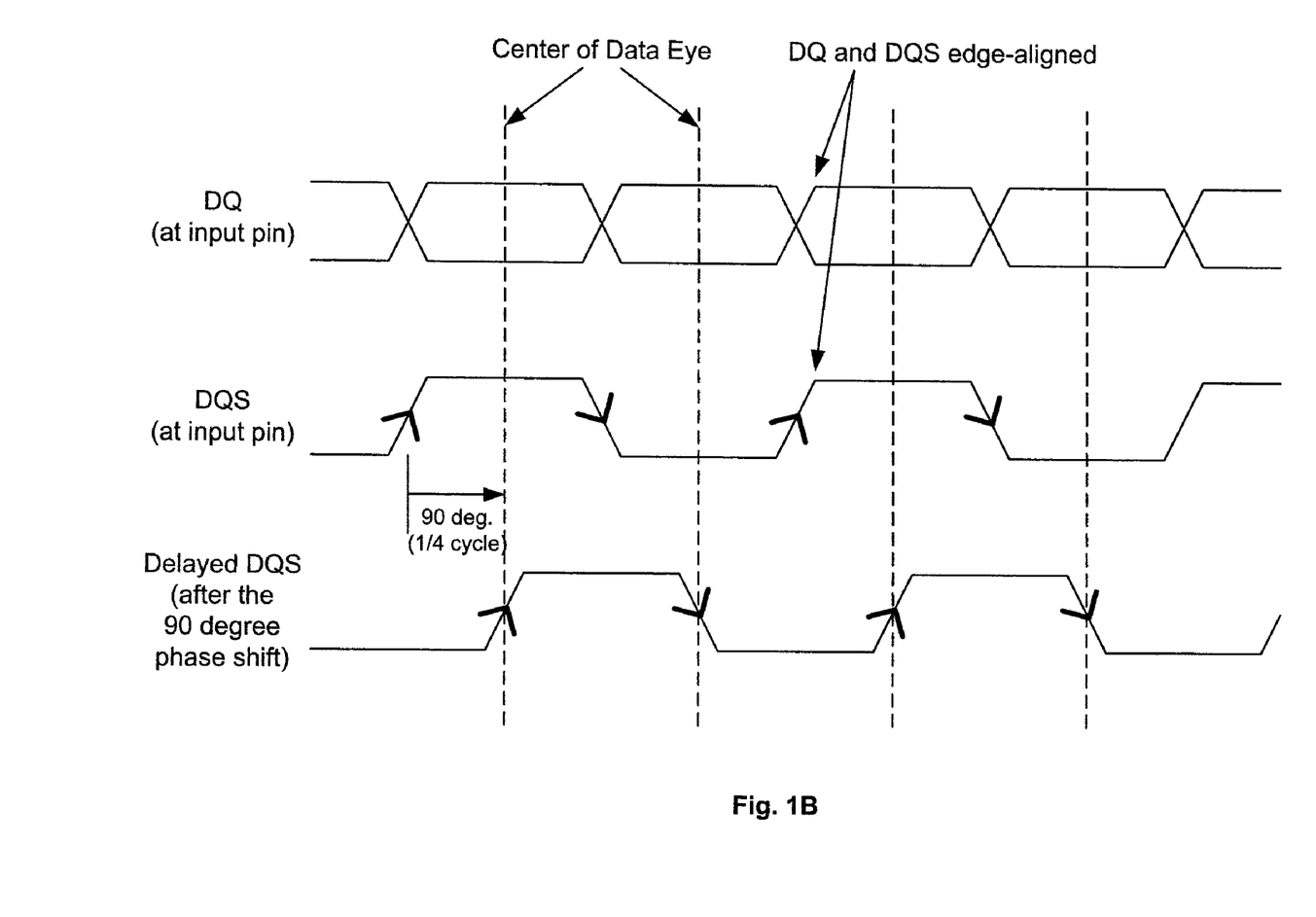
FIG. 1B is an illustration showing the delay in the data strobe signal relative to the received data signal as provided by delay chain, in accordance with one embodiment of the present invention.

FIG. 1B is an illustration showing the delay in the data strobe signal relative to the received data signal as provided by delay chain 135, in accordance with one embodiment of the present invention. As shown in FIG. 1B, the data signal (DQ) and data strobe signal (DQS) are received at the data input port 105 and data strobe input port 103, respectively, of the memory interface 100 in an edge-aligned manner. For example, in one embodiment, both the data signal (DQ) and the data strobe signal (DQS) are clocked off of a common system clock. The one-quarter clock period delay of the data strobe signal (DQS) provided by the delay chain 135 is intended to enable the data signal (DQ) to arrive at the I/O flip-flops 127/129 prior to arrival of the corresponding data strobe signal (DQS) at the I/O flip-flops 127/129, thus enabling the data signal (DQ) to be correctly captured by the I/O flip-flops 127/129.

Although transmission of the data strobe signal through the delay chain 135 is generally performed for the reasons discussed above, the data strobe signal path 103 includes a multiplexer 137 to provide an alternative to transmitting the data strobe signal through the delay chain 135. Specifically, a first input of the multiplexer 137 is defined to receive the data strobe signal directly from the output of the input buffer 133, thus bypassing the delay chain 135. A second input of the multiplexer 137 is defined to receive the one-quarter clock period delayed version of the data strobe signal from the output of the delay chain 135. The multiplexer 137 is set to pass through either the non-delayed data strobe signal received at its first input or the delayed data strobe signal received at its second input. The data strobe signal output from the multiplexer 137 is transmitted to an input of a buffer 139. The buffer 139 assists in driving the data strobe signal through the clock tree to each of the I/O flip-flops 127/129 in the memory interface 100.

From an output of the buffer 139, the data strobe signal is transmitted to an input of a coarse delay module 141. From an output of the coarse delay module 141, the data strobe signal is transmitted to an input of a fine delay module 143. From an output of the fine delay module 143, the data strobe signal is transmitted through the clock tree to clock ports associated with each of the I/o flip-flops 127/129. As previously mentioned, the I/O flip-flops 127 and 129 are connected to be clocked in an opposite manner, such that one I/O flip-flop associated with a given data path 101 receives the data strobe signal and the other I/O flip-flop associated with the given data path 101 receives an inverted version of the data strobe signal.

The coarse delay module 141 is defined to receive a control signal from a multiplexer 145. The control signal received by the coarse delay module 141 sets the amount of signal delay provided by the coarse delay module 141. More specifically, the control signal received by the coarse delay module 141 sets the number of serially connected coarse delay elements within the coarse delay module 141 through which the data signal is transmitted. The multiplexer 145 is defined to receive two input signals and a select signal. One of the multiplexer 145 input signals is passed through the multiplexer 145 in accordance with the multiplexer 145 select signal to serve as the control signal for the coarse delay module 141. Thus, each of the multiplexer 145 input signals represents the control signal for the coarse delay module 141. The first multiplexer 145 input signal is stored in a configuration memory cell 147 of the PLD. The second multiplexer 145 input signal in stored in a non-volatile memory cell 149. The multiplexer 145 select signal is stored in a configuration memory cell 151 of the PLD. Thus, the configuration memory cell 151 is configured to specify whether the control signal for the coarse delay module 141 is to be provided from the configuration memory cell 147 or from the non-volatile memory cell 149.

The fine delay module 143 is defined to receive a control signal from a multiplexer 153. The control signal received by the fine delay module 143 sets the amount of signal delay provided by the fine delay module 143. More specifically, the control signal received by the fine delay module 143 sets the number of serially connected fine delay elements within the fine delay module 143 through which the data signal is transmitted. The multiplexer 153 is defined to receive two input signals and a select signal. One of the multiplexer 153 input signals is passed through the multiplexer 153 in accordance with the multiplexer 153 select signal to serve as the control signal for the fine delay module 143. Thus, each of the multiplexer 153 input signals represents the control signal for the fine delay module 143. The first multiplexer 153 input signal is stored in a configuration memory cell 155 of the PLD. The second multiplexer 153 input signal in stored in a non-volatile memory cell 157. The multiplexer 153 select signal is stored in the same configuration memory cell 151 as the multiplexer 153 select signal. Thus, the configuration memory cell 151 is configured to specify whether the control signal for the fine delay module 143 is to be provided from the configuration memory cell 155 or from the non-volatile memory cell 157. Because both of the multiplexers 145 and 153 are defined to receive the same select control signal, the control signals for each of the coarse delay module 141 and the fine delay module 143 will both be provided from either configuration memory or non-volatile memory.

If the coarse and fine delay module 141/143 control signals are provided from non-volatile memory 149/157 as opposed to configuration memory 147/155, the coarse and fine delay module 141/143 control signals can be "burned" into the non-volatile memory 149/157 before the PLD is logically programmed. Thus, provision of the option for storing the coarse and fine delay module 141/143 control signals in the non-volatile memory 149/157 enables the amount of delay to be provided by the coarse and fine delay modules 141/143 to be determined based on test results before the PLD is logically programmed. Use of the configuration memory 147/155 requires that the delay settings of the coarse and fine delay modules 141/143 be predicted. However, use of the non-volatile memory 149/157 enables the delay settings of the coarse and fine delay modules 141/143 to be set based on measured skew between the data signal and the data strobe signal within the actual device.

Figure 1C:
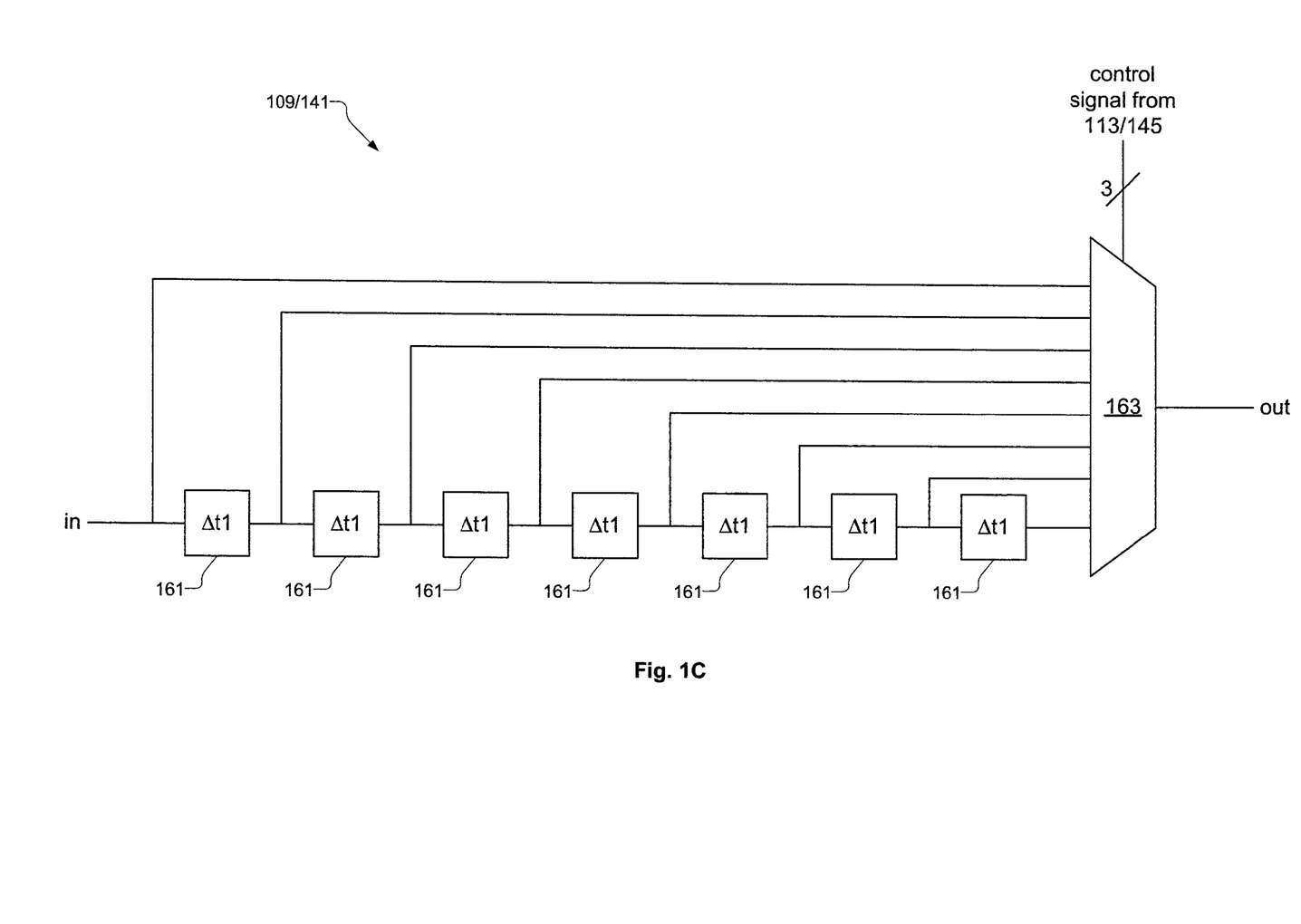
FIG. 1C is an illustration showing the coarse delay module, in accordance with one embodiment of the present invention.

FIG. 1C is an illustration showing the coarse delay module 109/141, in accordance with one embodiment of the present invention. The coarse delay module 109/141 includes a chain of serially connected coarse delay elements 161. Each of the coarse delay elements 161 is defined in a substantially equivalent manner such that a signal delay provided by each of the coarse delay elements 161 is substantially equivalent. The coarse delay module 109/141 also includes a multiplexer 163 defined to transmit one of a number of multiplexer 163 input signals as an output signal (out) of the coarse delay module 109/141, in accordance with the control signal 113/145 provided to the coarse delay module 109/141. The multiplexer 163 input signals include an input signal (in) as received by the coarse delay module 109/141 and each signal present at an output node of each coarse delay element 161. Thus, each multiplexer 163 input signal represents the input signal (in) received by the coarse delay module 109/141 having a different amount of delay introduced therein. Therefore, it should be appreciated that the coarse delay module is capable of delaying a received input signal by an integer multiple of the signal delay provided by an individual coarse delay element 161.

The exemplary coarse delay module 109/141 depicted in FIG. 1C shows the chain of serially connected coarse delay elements 161 as including seven coarse delay elements 161. Therefore, eight input signals are provided to the multiplexer 163, i.e., the as-received input signal and the delay signal present at the output node of each coarse delay element 161. To provide for full functionality, the control signal 113/145 provided to the 8-to-1 multiplexer 163 is a 3-bit control signal. It should be understood, however, that the present invention is not intended to be limited to the particular number of coarse delay elements 161 shown in FIG. 1C. In other embodiments, the coarse delay module 109/141 can include essentially any number of coarse delay elements 161 in the chain of serially connected coarse delay elements 161. Also, in other embodiments, the control signal 113/145 can be defined by a number of bits sufficient to enable full functionality of the multiplexer 163.

Figure 1D:
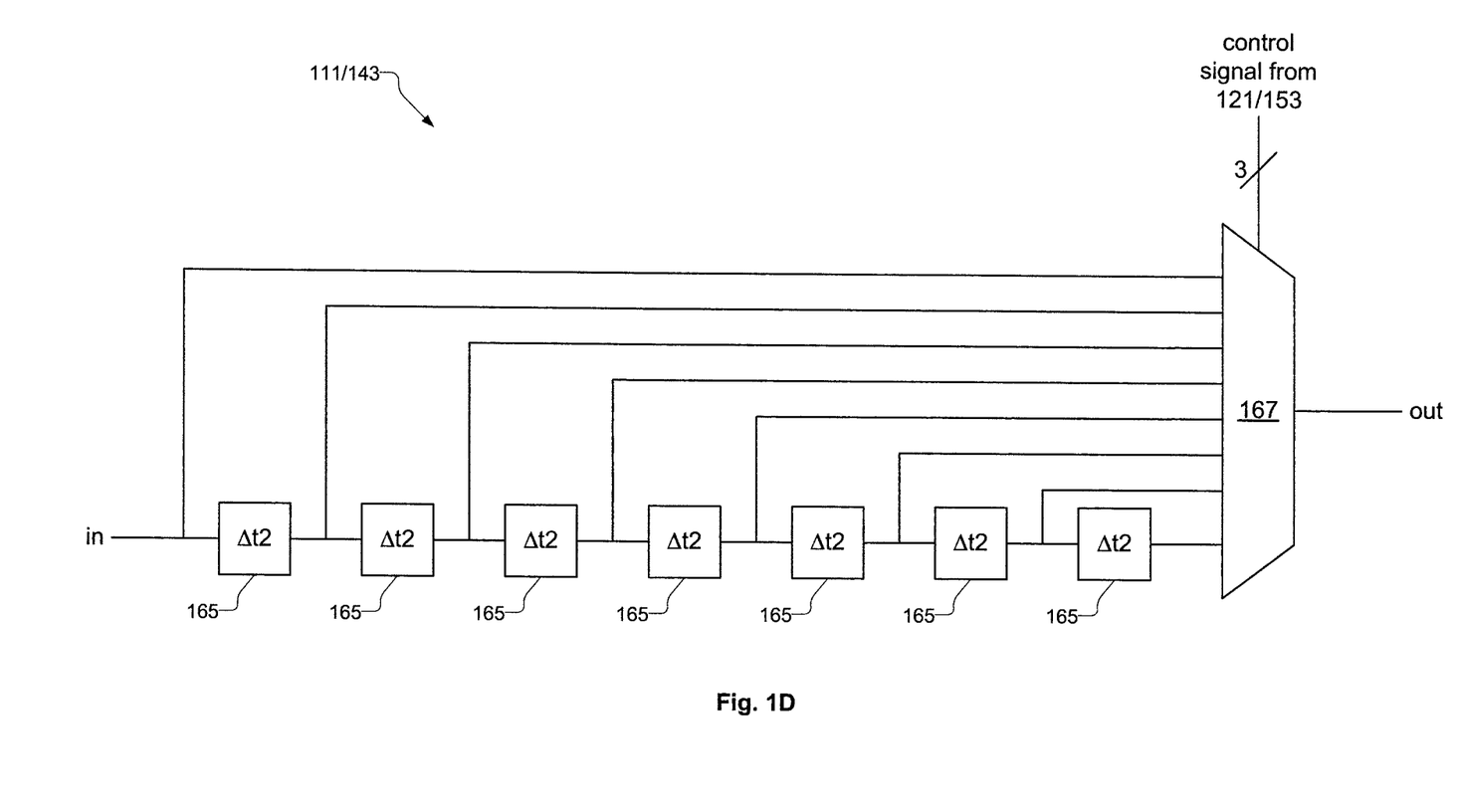
FIG. 1D is an illustration showing the fine delay module, in accordance with one embodiment of the present invention.

FIG. 1D is an illustration showing the fine delay module 111/143, in accordance with one embodiment of the present invention. The fine delay module 111/143 includes a chain of serially connected fine delay elements 165. Each of the fine delay elements 165 is defined in a substantially equivalent manner such that a signal delay provided by each of the fine delay elements 165 is substantially equivalent. The fine delay module 111/143 also includes a multiplexer 167 defined to transmit one of a number of multiplexer 167 input signals as an output signal (out) of the fine delay module 111/143, in accordance with the control signal 121/153 provided to the fine delay module 111/143. The multiplexer 167 input signals include an input signal (in) as received by the fine delay module 111/143 and each signal present at an output node of each fine delay element 165. Thus, each multiplexer 167 input signal represents the input signal (in) received by the fine delay module 111/143 having a different amount of delay introduced therein. Therefore, it should be appreciated that the fine delay module 111/143 is capable of delaying a received input signal by an integer multiple of the signal delay provided by an individual fine delay element 165.

The exemplary fine delay module 111/143 depicted in FIG. 1D shows the chain of serially connected fine delay elements 165 as including seven fine delay elements 165. Therefore, eight input signals are provided to the multiplexer 167, i.e., the as-received input signal and the delayed signal present at the output node of each fine delay element 165. To provide for full functionality, the control signal 121/153 provided to the 8-to-1 multiplexer 167 is a 3-bit control signal. It should be understood, however, that the present invention is not intended to be limited to the particular number of fine delay elements 165 shown in FIG. 1D. In other embodiments, the fine delay module 111/143 can include essentially any number of fine delay elements 165 in the chain of serially connected fine delay elements 165. Also, in other embodiments, the control signal 121/153 can be defined by a number of bits sufficient to enable full functionality of the multiplexer 167.

With reference to the memory controller 100 of FIG. 1A, bypassing the delay chain 135, it is desirable to have essentially zero skew between the data signal path 101 and the data strobe signal path 103. If the delay in the data signal path 101 is greater than the delay in the data strobe signal path 103 (bypassing the delay chain 135), the coarse and fine delay modules 141/143 are set to increase the delay in the data strobe signal path 103, such that the delay in each of the data signal path 101 and data strobe signal path 103 is essentially equivalent. Conversely, if the delay in the data strobe signal path 103 (bypassing the delay chain 135) is greater than the delay in the data signal path 101, the coarse and fine delay modules 109/111 are set to increase the delay in the data signal path 101, such that the delay in each of the data signal path 101 and data strobe signal path 103 is essentially equivalent. To appropriately set the coarse and fine delay modules 109/111/141/143, it is necessary to have a measure of the signal delay in each of the data signal path 101 and data strobe signal path 103 (bypassing the delay chain 135).

Figure 2A:
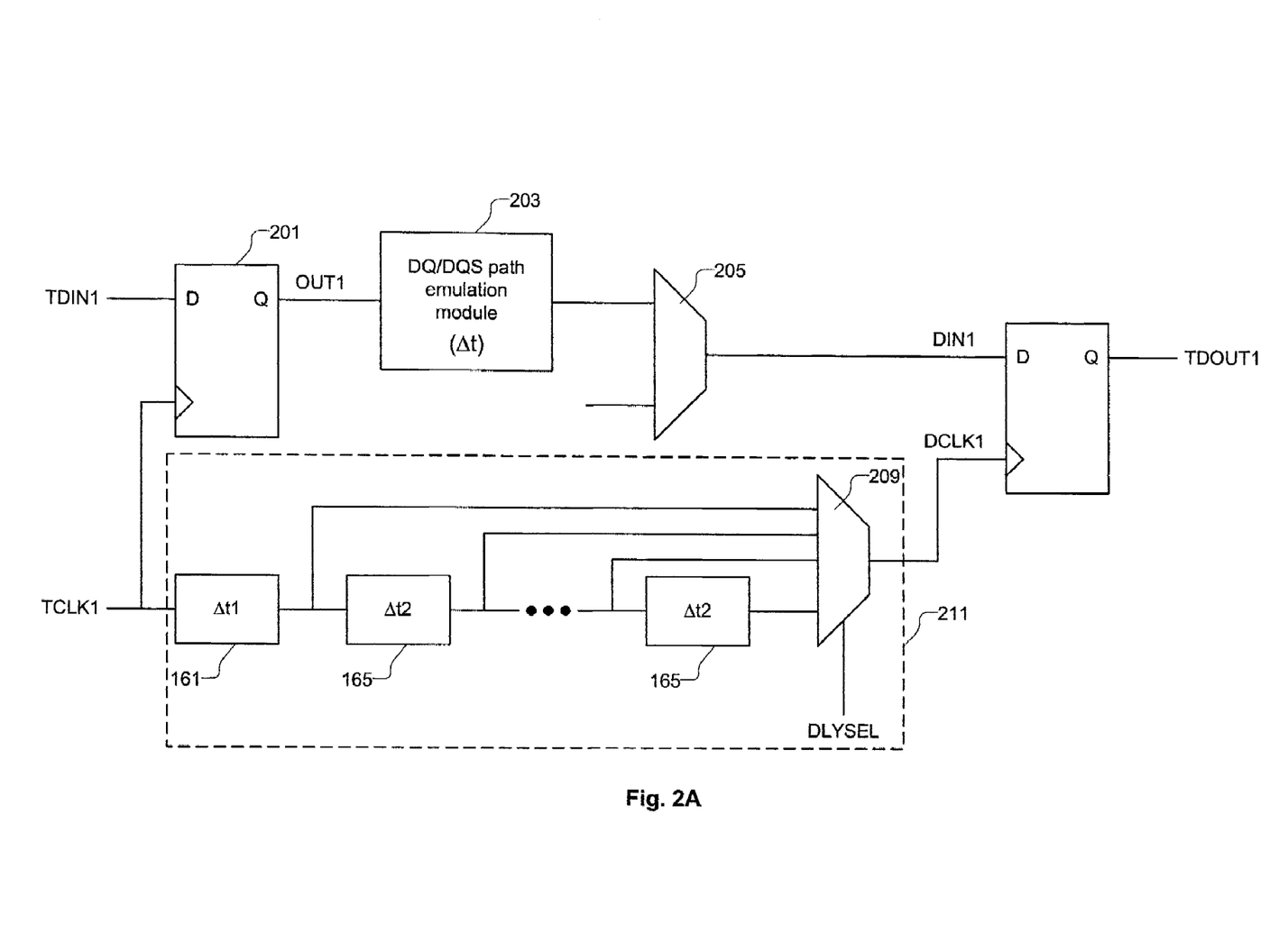
FIG. 2A is an illustration showing a delay measurement circuit for measuring the signal delay in each of the data signal path and data strobe signal path (bypassing the delay chain), in accordance with one embodiment of the present invention.

FIG. 2A is an illustration showing a delay measurement circuit 200 for measuring the signal delay in each of the data signal path 101 and data strobe signal path 103 (bypassing the delay chain 135), in accordance with one embodiment of the present invention. The delay measurement circuit 200 is defined to use a racing condition to measure the signal delay in an emulation of the data signal path 101 and the data strobe signal path 103. The circuit 200 includes an emulation module 203 connected between an input register 201 and an output register 207. The emulation module 203 is defined to emulate either the data signal path 101 or the data strobe signal path 103, depending on which of the path's 101/103 delay is to be measured. It should be appreciated that the emulation module 203 for the data signal path 101 emulates the signal delay from the data signal port 105 to the data input port of the I/O flip-flops 127/129. Also, it should be appreciated that the emulation module 203 for the data strobe signal path 103 emulates the signal delay from the data strobe signal port 131 to the clock port of the I/O flip-flops 127/129 (bypassing the delay chain 135).

The input register 201 is defined to receive a test data input signal (TDIN1). The test data input signal (TDIN1) is clocked into and out of the input register 201 in accordance with a test clock signal (TCLK1). The output signal (OUT1) from the input register 201 is transmitted through the emulation module 203, through a multiplexer 205, and is received at the output register 207 as delayed test data signal (DIN1). The delayed test data signal (DIN1) is clocked into and out of the output register 207 in accordance with a delayed test clock signal (DCLK1). The signal clocked out of the output register 207 is the test data output signal (TDOUT1).

The delay present between the test clock signal (TCLK1) and the delayed test clock signal (DCLK1) is adjustable via a delay chain 211. The delay chain 211 includes a coarse delay element 161 connected to a chain of serially connected fine delay elements 165. The delay chain 211 includes a multiplexer 209 defined to transmit one of a number of multiplexer 209 input signals as the delayed test clock signal (DCLK1), in accordance with a delay select signal (DLYSEL). The multiplexer 209 input signals include the delayed clock signal present at an output node of the coarse delay element 161 and each of the delayed clock signals present at an output node of each fine delay element 165. Thus, each multiplexer 209 input signal represents the test clock signal (TCLK1) having a different amount of delay introduced therein. It should be appreciated that in various embodiments, the number of coarse and fine delay elements 161/165 in the delay chain 211 can vary depending on the amount of signal delay provided by the emulation module 203.

Figure 2B:
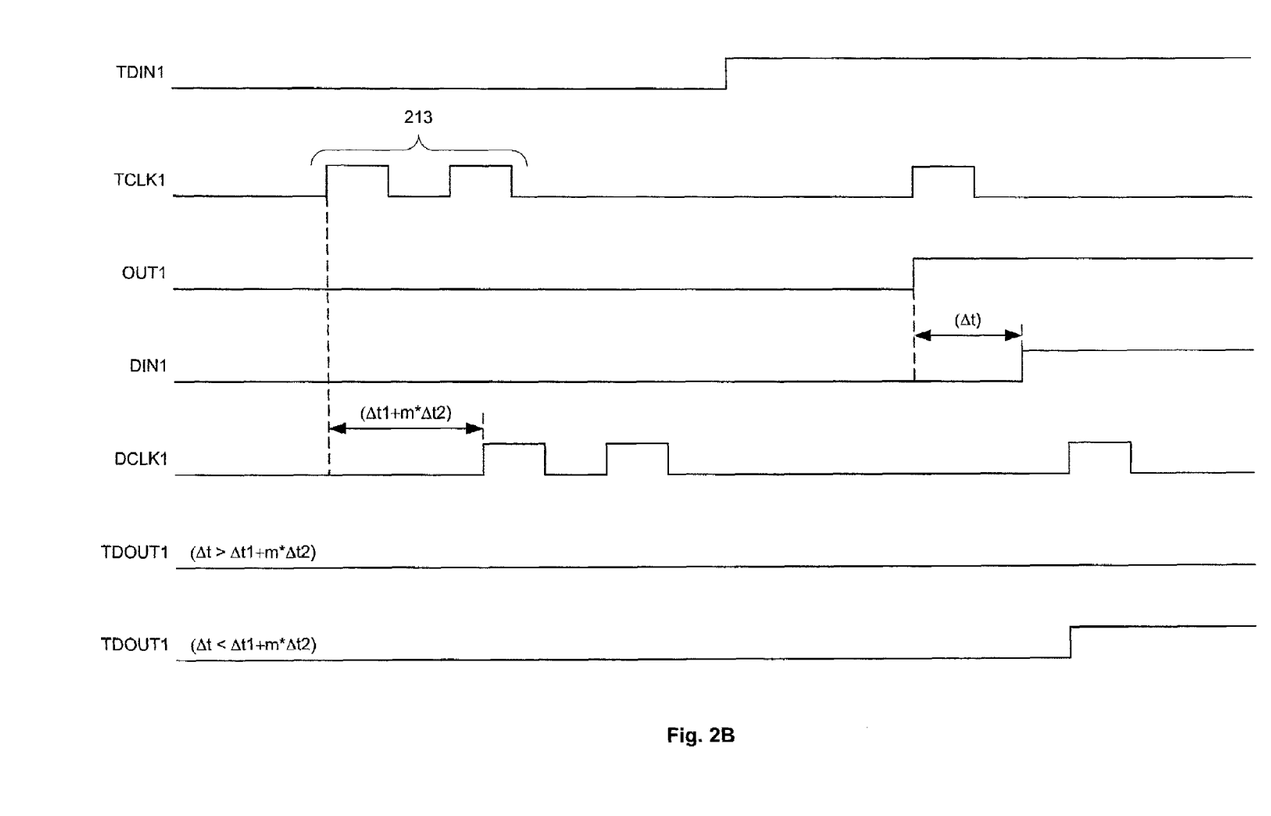
FIG. 2B is an illustration showing waveforms associated with operation of the delay measurement circuit, in accordance with one embodiment of the present invention.

FIG. 2B is an illustration showing waveforms associated with operation of the delay measurement circuit 200, in accordance with one embodiment of the present invention. For a given delay measurement, the test clock signal (TCLK1) is delayed by an amount ($\Delta t1 + m^*\Delta t2$) to generate the delayed test clock signal (DCLK1), where $\Delta t1$ is the delay provided by the coarse delay element 161, $\Delta t2$ is the delay provided by the fine delay element 165, and the integer number (m) represents the number of fine delay elements 165 that are selected to contribute to the test clock signal delay.

The delay measurement is initiated by transmitting a pair of reset pulses 213 in the test clock signal (TCLK1) while maintaining a low state of the test data input signal (TDIN1) to clear the input and output registers 201/207. Then, the test data input signal (TDIN1) is driven high. At this point, the delay measurement circuit 200 is prepared for racing of the test data input signal (TDIN1) and the test clock signal (TCLK1) to the output register 207. To initiate the signal race, the test clock signal (TCLK1) is pulsed. When the test clock signal (TCLK1) is pulsed, the high test data input signal (TDIN1) is clocked out of the input register 201 as the signal (OUT1). The delayed test data input signal (DIN1) then arrives at the output register 207 with the signal delay provided by the emulation module 203 and the multiplexer 205. It should be appreciated that the multiplexer 205 is defined to mirror the multiplexer 209, such that both the test data signal path and the test clock signal path include the same amount of multiplexer 205/209 delay.

The delayed test clock signal (DCLK1) arrives at the clock port of the output register 207 with the delay ($\Delta t1 + m^*\Delta t2$) provided by the delay chain 211. If the data signal path has a longer delay than the test clock signal path, i.e., ($\Delta t > \Delta t1 + m^*\Delta t2$), the output register 207 will not catch the high delayed test data input signal (DIN1) and the test data output signal (TDOUT1) will remain low. If the data signal path has a shorter delay than the test clock signal path, i.e., ($\Delta t < \Delta t1 + m^*\Delta t2$), the output register 207 will catch the high delayed test data input signal (DIN1) and the test data output signal (TDOUT1) will go high. The delay measurement is performed by incrementally increasing the test clock signal delay provided by the delay chain 211 until the output register 207 catches the high delayed test data signal (DIN1).

When the output register 207 catches the high delayed test data signal (DIN1), the skew between the test data signal path and the test clock signal path is less than a setup time of the output register 207, e.g., less than about 30 picoseconds. The measured delay in the emulated signal path (data signal path 101 or data strobe signal path 103) is approximately equal to the delay ($\Delta t1 + m^*\Delta t2$) provided by the delay chain 211, where (m) is the number fine delay elements 165 selected when the output register 207 catches the high delayed test data signal (DIN1).

Figure 3A:
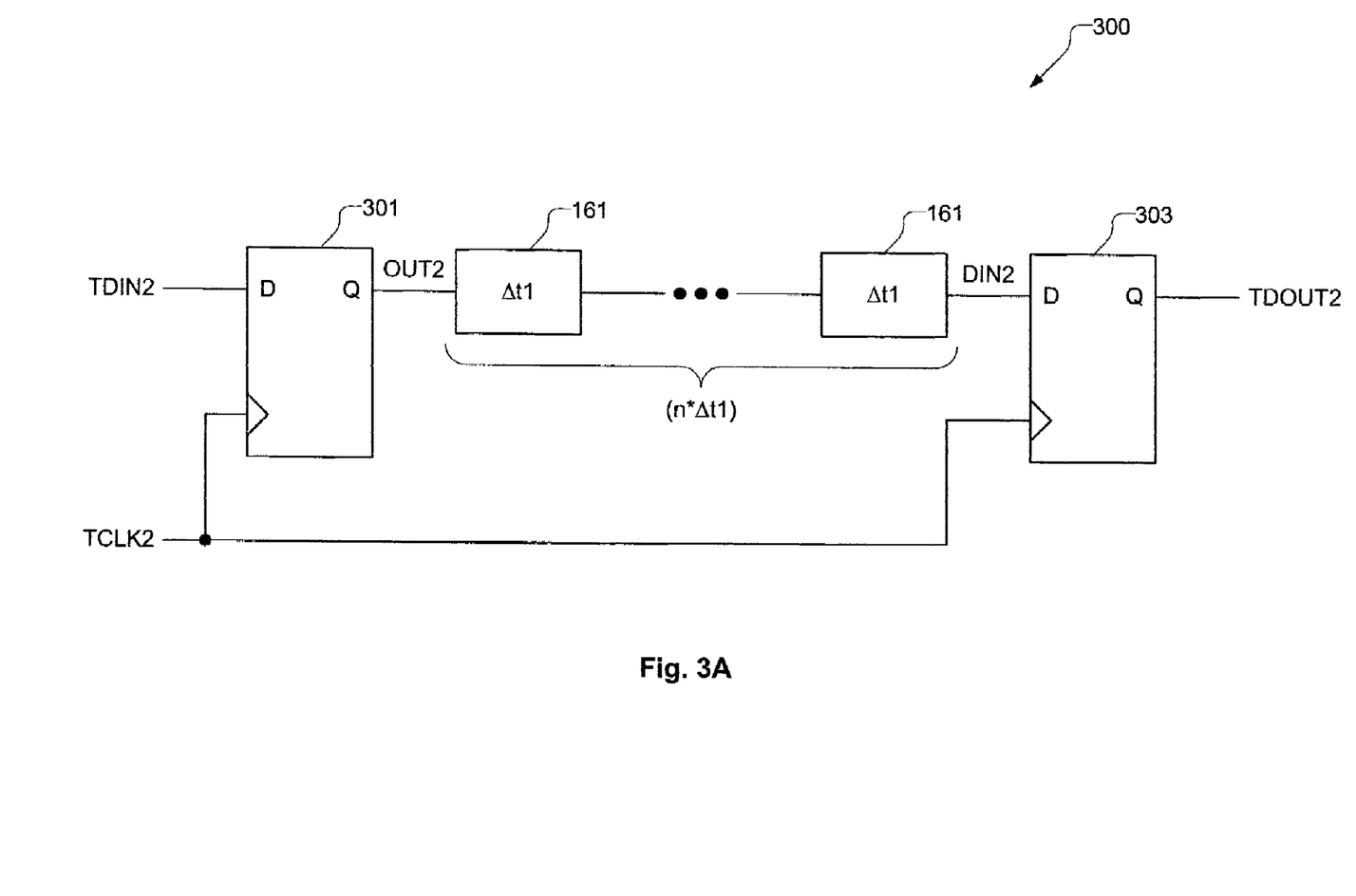
FIG. 3A is an illustration showing a coarse delay element calibration circuit, in accordance with one embodiment of the present invention.

In accordance with the foregoing, the coarse delay element 161 and the fine delay element 165 can be calibrated to enable accurate quantification of the signal delay measurement obtained using the delay measurement circuit 200. FIG. 3A is an illustration showing a coarse delay element calibration circuit 300, in accordance with one embodiment of the present invention. The calibration circuit 300 includes a chain of serially connected coarse delay elements 161 connected between an input register 301 and an output register 303. The input register 301 is defined to receive a test data input signal (TDIN2). The test data input signal (TDIN2) is clocked through the input register 301 in accordance with a test clock signal (TCLK2). The output signal (OUT2) from the input register 301 is transmitted through the chain of serially connected coarse delay elements 161 and is received at the output register 303 as delayed test data signal (DIN2). The delayed test data signal (DIN2) is clocked through the output register 303 in accordance with the test clock signal (TCLK2). The signal clocked out of the output register 303 is the test data output signal (TDOUT2). Also, the number (n) of coarse delay elements 161 is selected such that the total signal delay provided by the chain of serially connected coarse delay elements 161 is at least as large as the minimum achievable period of the test clock signal (TCLK2).

Figure 3B:
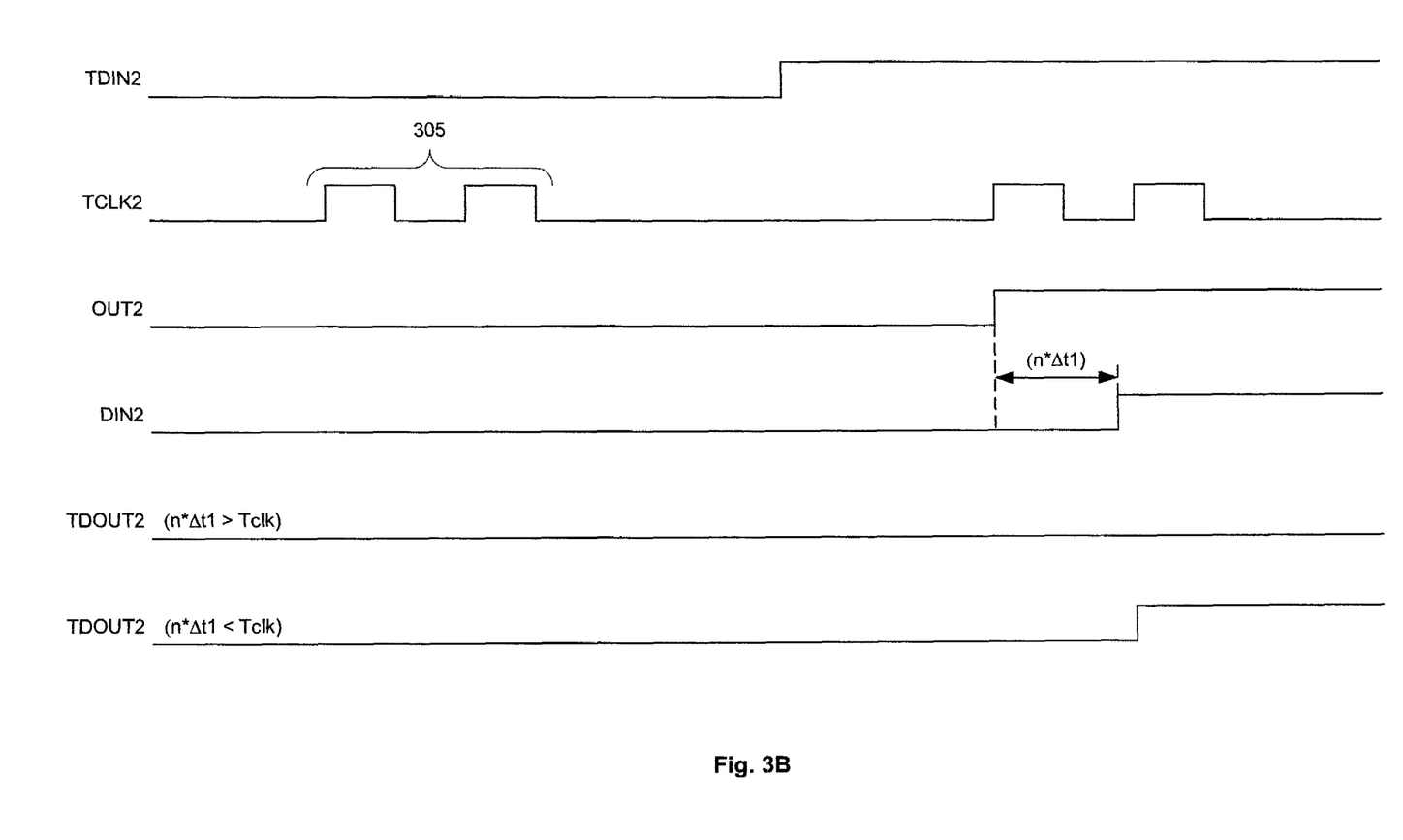
FIG. 3B is an illustration showing waveforms associated with operation of the coarse delay element calibration circuit, in accordance with one embodiment of the present invention.

The calibration circuit 300 is defined to use a racing condition to measure the total signal delay (n*Δt1) provided by the chain of serially connected coarse delay elements 161. FIG. 3B is an illustration showing waveforms associated with operation of the coarse delay element calibration circuit 300, in accordance with one embodiment of the present invention. The test data input signal (TDIN2) is delayed by an amount (n*Δt1) to generate the delayed test data signal (DIN2). The calibration measurement is initiated by transmitting a pair of reset pulses 305 in the test clock signal (TCLK2) while maintaining a low state of the test data input signal (TDIN2) to clear the input and output registers 301/303. Then, the test data input signal (TDIN2) is driven high. At this point, the calibration circuit 300 is prepared for racing of the test data input signal (TDIN2) and the test clock signal (TCLK2) to the output register 303. To perform the signal race, the test clock signal (TCLK2) is pulsed twice with a clock period of Tclk. When the test clock signal (TCLK2) is pulsed, the high test data input signal (TDIN2) is clocked through the input register 301 as the signal (OUT2). The delayed test data signal (DIN2) then arrives at the output register 303 with the signal delay of n*Δt1 relative to the signal (OUT2).

If the data signal path has a longer delay than the clock period Tclk, i.e., (n*Δt1>Tclk), the output register 303 will not catch the high delayed test data signal (DIN2) and the test data output signal (TDOUT2) will remain low. If the data signal path has a shorter delay than the clock period Tclk, i.e., (n*Δt1<Tclk), the output register 303 will catch the high delayed test data signal (DIN2) and the test data output signal (TDOUT2) will go high. The delay measurement is performed by gradually increasing the test clock period Tclk until the output register 303 catches the high delayed test data signal (DIN2). When the output register 303 catches the high delayed test data signal (DIN2), total delay (n*Δt1) is closely matched with the test clock period Tclk. Thus, the signal delay provided by an individual coarse delay element 161 can be calibrated as the test clock period Tclk divided by (n).

In one embodiment, the test clock signal is generated by a phase lock loop (PLL) circuit. The PLL circuit can be defined to enable discrete adjustment of the period of the test clock signal Tclk. For example, a multiplier module within a feedback path of the PLL circuit, which is defined to control the signal frequency, i.e., signal period, output by the PLL circuit, can be multiplexed to enable selection of different multiplier values, wherein selection of different multiplier values provides a corresponding adjustment in the period of the signal output by the PLL circuit. It should be appreciated that above-mentioned PLL circuit for adjusting the test clock period Tclk is provided by way of example. Other embodiments may use different techniques to adjust the test clock period Tclk, so long as the adjusted test clock period Tclk is known.

In one embodiment, an approach similar to that described with respect to the coarse delay element 161 calibration circuit 300 of FIGS. 3A-3B can be used to calibrate the fine delay element 165. However, as the signal delay provided by the fine delay element 165, e.g., 30 picoseconds, can be substantially smaller than the minimum achievable test clock period Tclk, e.g., 10 nanoseconds, it could take a very large number of serially connected fine delay elements 165 to implement a fine delay element 165 calibration circuit similar to the calibration circuit 300 of FIG. 3A.

Figure 4A:
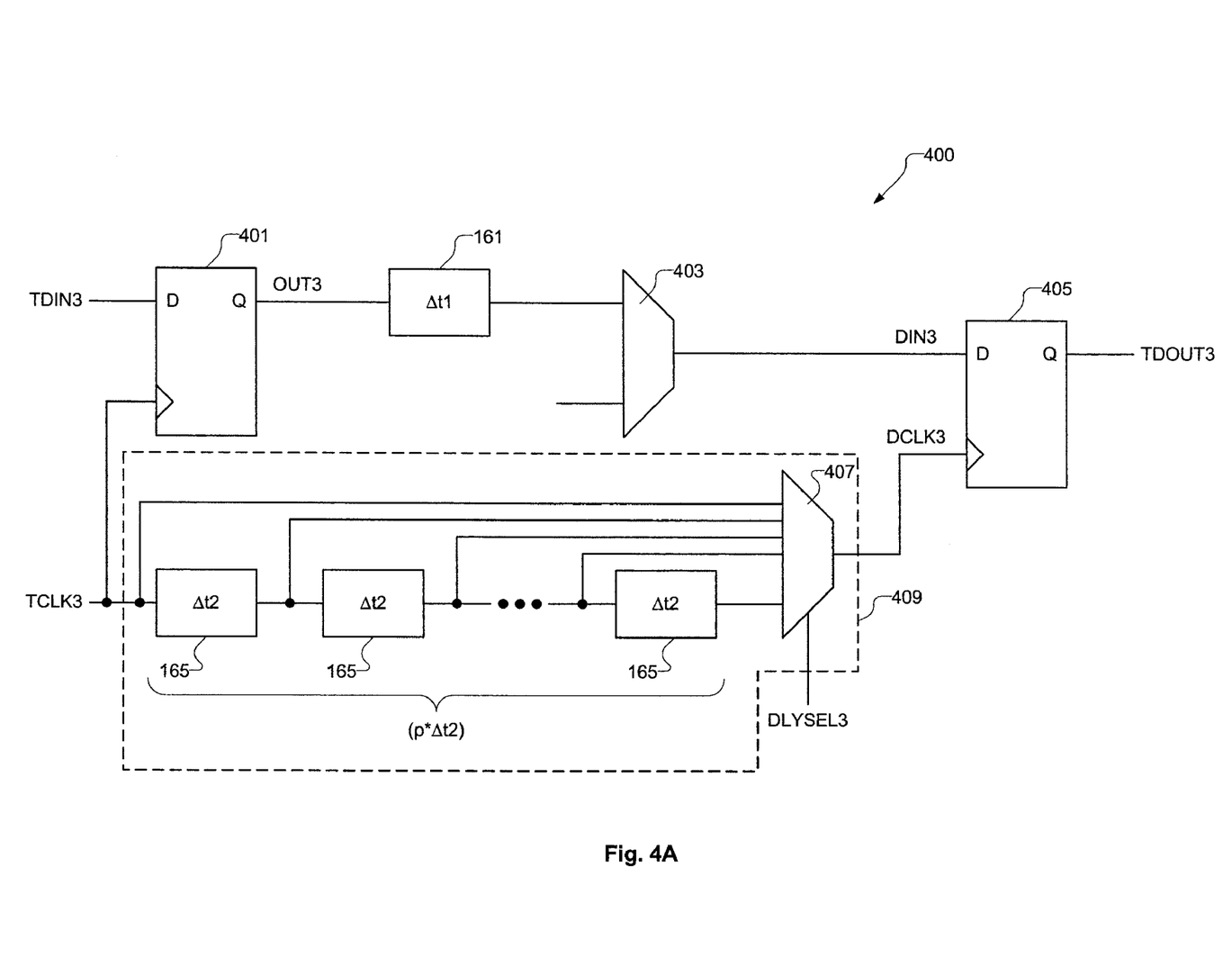
FIG. 4A is an illustration showing a fine delay element calibration circuit, in accordance with one embodiment of the present invention.

FIG. 4A is an illustration showing a fine delay element calibration circuit 400, in accordance with one embodiment of the present invention. The calibration circuit 400 is defined to use a racing condition to measure the delay provided by the fine delay element 165. An input register 401 is connected to receive a test data input signal (TDIN3). The test data input signal (TDIN3) is clocked through the input register 401 as the signal (OUT3), in accordance with a test clock signal (TCLK3). The signal (OUT3) is transmitted through a coarse delay element 161, through a multiplexer 403, to be received as a delayed test data signal (DIN3) at an input port of an output register 405. The delayed test data signal (DIN3) received by the output register 405 is clocked through the output register 405 as the test data output signal (TDOUT3), in accordance with a delayed test clock signal (DCLK3). It should be appreciated that the multiplexer 403 is defined to mirror the multiplexer 407, such that both the test data signal path and the test clock signal path include the same amount of multiplexer 403/407 delay.

The delay present between the test clock signal (TCLK3) and the delayed test clock signal (DCLK3) is adjustable via a delay chain 409. The delay chain 409 includes a chain of serially connected fine delay elements 165. The delay chain 409 includes a multiplexer 407 defined to transmit one of a number of multiplexer 407 input signals as the delayed test clock signal (DCLK3), in accordance with a delay select signal (DLYSEL3). The multiplexer 407 input signals include the original test clock signal (TCLK3) and the delayed clock signal present at an output node of each fine delay element 165 in the chain of serially connected fine delay elements 165. Thus, each multiplexer 407 input signal represents the test clock signal (TCLK3) having a different amount of delay introduced therein. It should be appreciated that in various embodiments, the number (p) of fine delay elements 165 in the delay chain 409 can vary depending on the amount of signal delay provided by the coarse delay element 161.

Figure 4B:
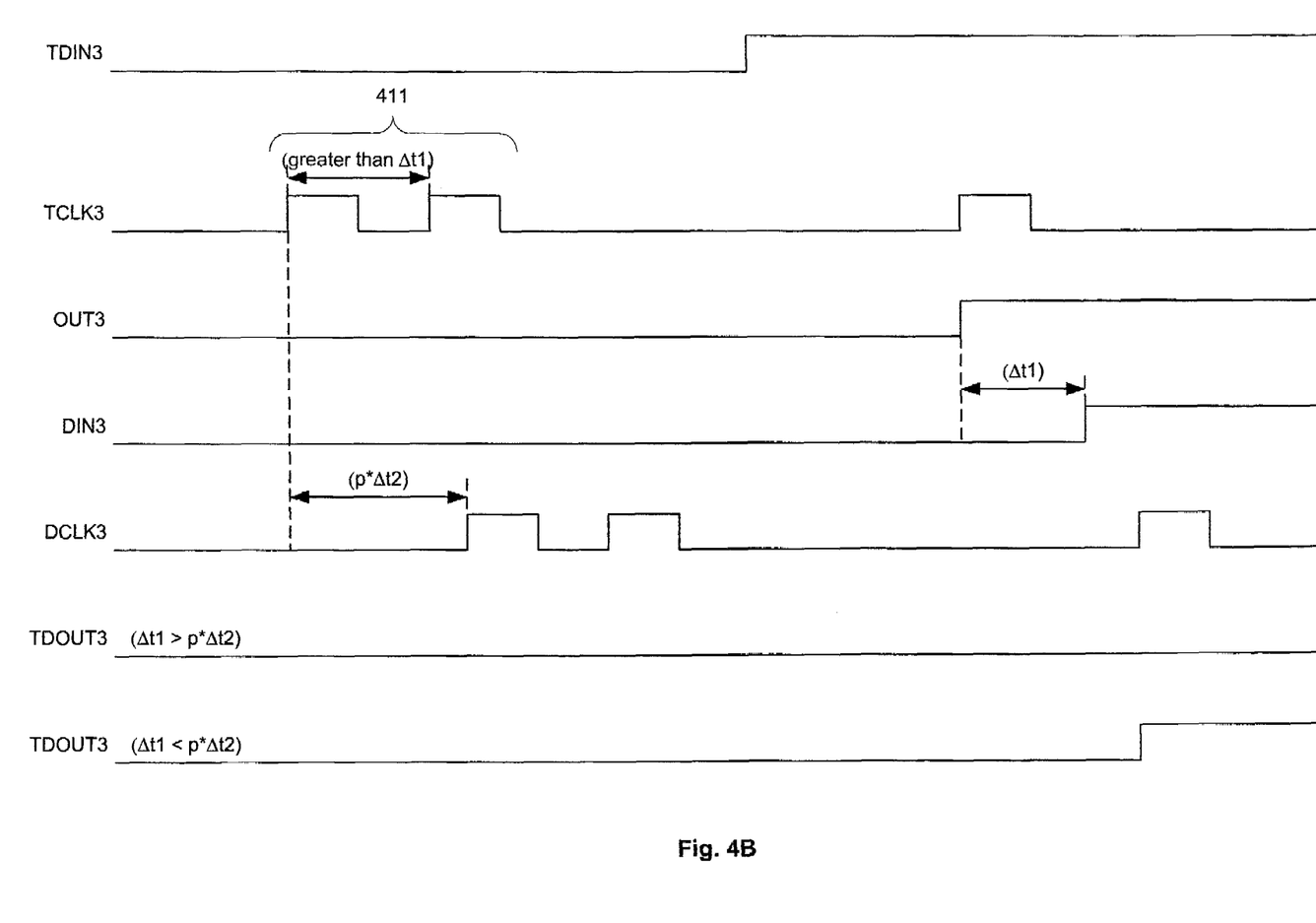
FIG. 4B is an illustration showing waveforms associated with operation of the coarse delay element calibration circuit, in accordance with one embodiment of the present invention.

FIG. 4B is an illustration showing waveforms associated with operation of the coarse delay element calibration circuit 400, in accordance with one embodiment of the present invention. The calibration measurement is initiated by transmitting a pair of reset pulses 411 in the test clock signal (TCLK3) while maintaining a low state of the test data input signal (TDIN3) to clear the input and output registers 401/405. Then, the test data input signal (TDIN3) is driven high. At this point, the calibration circuit 400 is prepared for racing of the test data input signal (TDIN3) and the test clock signal (TCLK3) to the output register 405.

To initiate the signal race, the test clock signal (TCLK3) is pulsed. When the test clock signal (TCLK3) is pulsed, the high test data input signal (TDIN3) is clocked through the input register 401 as the signal (OUT3). The delayed test data signal (DIN3) then arrives at the output register 405 with the signal delay provided by the coarse delay element 161 and the multiplexer 403. The delayed test clock signal (DCLK3) arrives at the clock port of the output register 405 with the selected delay (p*Δt2) provided by the delay chain 409. If the data signal path has a longer delay than the test clock signal path, i.e., (Δt1>p*Δt2, where p is the number of fine delay elements 165 that are selected to contribute to the test clock signal delay), the output register 405 will not catch the high delayed test data signal (DIN3) and the test data output signal (TDOUT3) will remain low. If the data signal path has a shorter delay than the test clock signal path, i.e., (Δt1<p*Δt2), the output register 405 will catch the high delayed test data input signal (DIN3) and the test data output signal (TDOUT3) will go high. The fine delay element calibration is performed by incrementally increasing the test clock signal delay provided by the delay chain 409 until the output register 405 catches the high delayed test data signal (DIN3).

When the output register 405 catches the high delayed test data signal (DIN3), the skew between the test data signal path and the test clock signal path is less than a setup time of the output register 405, e.g., less than about 30 picoseconds. When the output register 405 catches the high delayed test data signal (DIN3), the total signal delay provided by the selected number of fine delay elements 165 according to the select signal (DLYSEL3) is closely matched with the signal delay provided coarse delay element 161. Thus, the signal delay provided by an individual fine delay element 165 can be calibrated as the signal delay provide by an individual coarse delay element divided by the selected number of fine delay elements 165 in the delay chain 409 when the output register 405 catches the high delayed test data signal (DIN3).

Figure 5:
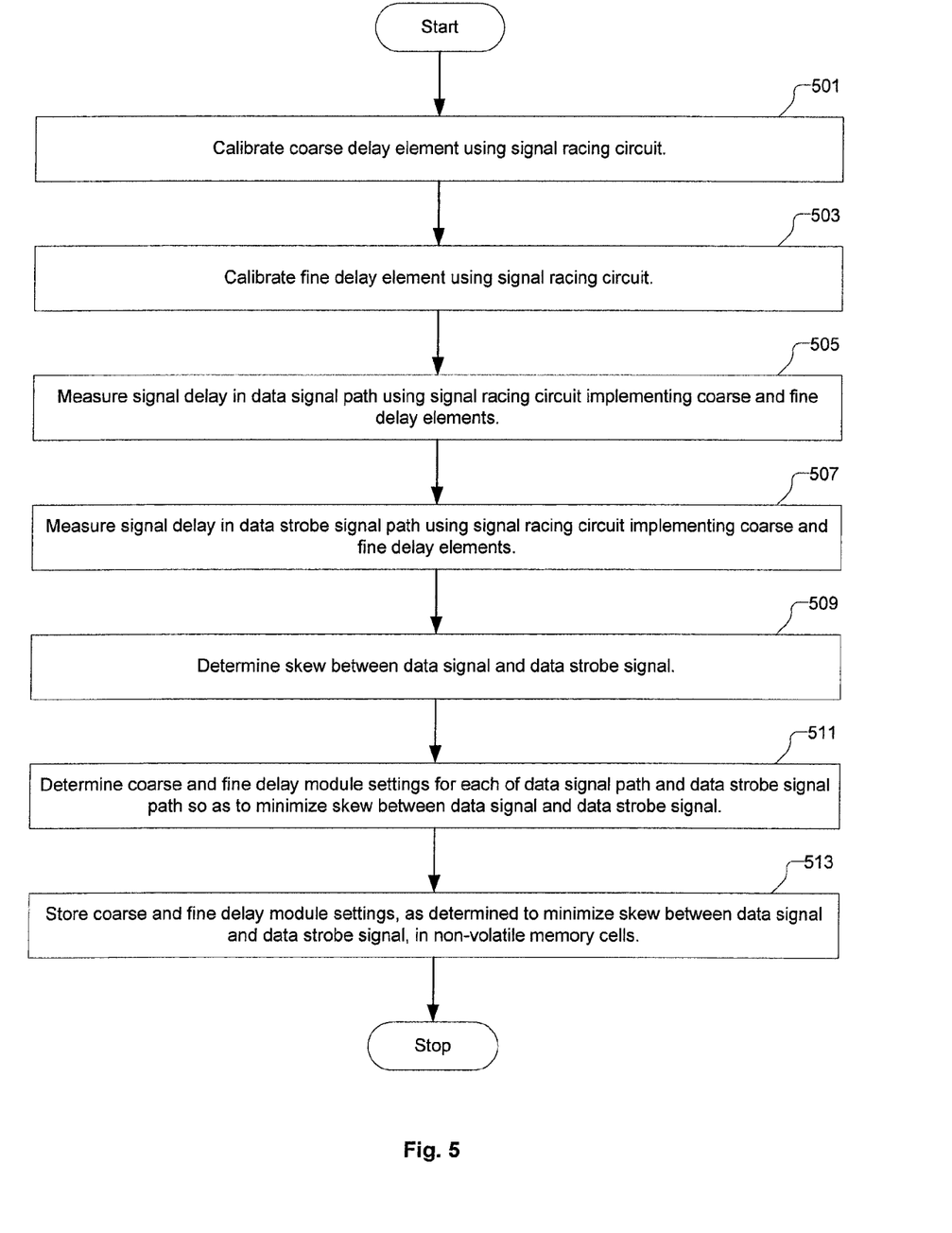
FIG. 5 is an illustration showing a flowchart of a method for minimizing skew between a data signal and a data strobe signal, in accordance with one embodiment of the present invention.

FIG. 5 is an illustration showing a flowchart of a method for minimizing skew between a data signal and a data strobe signal, in accordance with one embodiment of the present invention. The method includes an operation 501 for calibrating a coarse delay element using a signal racing circuit. In one embodiment, the operation 501 is performed using the coarse delay element calibration circuit 300 as previously described with regard to FIGS. 3A-3B. The method includes another operation 503 for calibrating a fine delay element using a signal racing circuit. In one embodiment, the operation 503 is performed using the fine delay element calibration circuit 400 as previously described with regard to FIGS. 4A-4B.

The method continues with an operation 505 for measuring a signal delay in a data signal path using a signal racing circuit that implements the coarse and fine delay modules calibrated in operations 501 and 503, respectively. In one embodiment, the operation 505 is performed using the signal delay measurement circuit 200 as previously described with regard to FIGS. 2A-2B, wherein the emulation module 203 is defined to emulate the data signal path. The method further includes an operation 507 for measuring a signal delay in a data strobe signal path using a signal racing circuit that implements the coarse and fine delay modules calibrated in operations 501 and 503, respectively. In one embodiment, the operation 507 is performed using the signal delay measurement circuit 200 as previously described with regard to FIGS. 2A-2B, wherein the emulation module 203 is defined to emulate the data strobe signal path.

It should be appreciated that the method operations 501, 503, 505, and 507 are performed using circuitry that is fabricated in situ on the actual device within which the skew between the data signal and the data strobe signal is to be minimized. Thus, the measured delay associated with each of the coarse and fine delay elements, the emulated data signal path, and the emulated data strobe signal path is subject to the same fabrication-dependent attributes that affect the actual circuitry through which the data signal and data strobe signal will be transmitted.

The method continues with an operation 509 for determining the skew between the data signal and the data strobe signal. The skew is determined by calculating a difference in the measured delays for the data signal path and data signal strobe path. In an operation 511, appropriate settings for the coarse and fine delay modules in each of the data signal path and data strobe path are determined such that skew between the data signal and data strobe signal is minimized. If the data signal is delayed relative to the data strobe signal, the coarse and fine delay modules for the data strobe signal path will be set to introduce delay in the data strobe signal path such that the data signal and data strobe signal are subject to approximately equivalent delays. Conversely, if the data strobe signal is delayed relative to the data signal, the coarse and fine delay modules for the data signal path will be set to introduce delay in the data signal path such that the data signal and data strobe signal are subject to approximately equivalent delays.

In an operation 513, the coarse and fine delay module settings determined in the operation 511 are stored in non-volatile memory elements on the particular device. In one embodiment, the operations 511 and 513 are performed using the memory interface 100 configuration described with regard to FIGS. 1A-1D. It should be understood that the non-volatile memory element using in conjunction with operation 513 can be essentially any type of non-volatile memory, such as a poly fuse. It should be appreciated that because the skew adjustment provided by the method is tailored to a particular device, fabrication process variations which affect signal skew among different devices can be compensated for on a device-specific basis, thus optimizing individual device performance and improving device yield.

The method and apparatus for quantifying and minimizing skew between two signals as disclosed herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A signal delay measurement circuit, comprising:
an input register defined to receive a test data signal and output the test data signal in accordance with a test clock signal;
an output register defined to receive a delayed version of the test data signal and output the delayed version of the test data signal in accordance with a delayed version of the test clock signal;
an emulation module connected between the input register and the output register, the emulation module defined to emulate an actual signal transmission path for which signal delay is to be measured, the emulation module defined to introduce signal delay in the test data signal as the test data signal is transmitted from the input register to arrive at the output register as the delayed version of the test data signal; and a delay chain defined to introduce a controllable amount of signal delay in the test clock signal to generate the delayed version of the test clock signal, wherein a measured delay of the emulated signal path is calculated from the delayed version of the test clock signal when the delayed version of the test data signal is clocked through the output register.

2. A signal delay measurement circuit as recited in claim 1, wherein each of the input and output registers is defined as a flip-flop.

3. A signal delay measurement circuit as recited in claim 1, wherein the actual signal transmission path for which the emulation module is defined is either a data signal path of a memory controller interface or a data strobe signal path of the memory controller interface.

4. A signal delay measurement circuit as recited in claim 1, wherein a total amount of signal delay to be introduced by the delay chain represents a signal delay between arrival of the test clock signal at the input register and arrival of the delayed version of the test clock signal at the output register.

5. A signal delay measurement circuit as recited in claim 1, wherein the delay chain includes a number of serially connected delay elements, an output node of each serially connected delay element connected to a respective input of a multiplexer, the multiplexer defined to pass through one of its inputs as the delayed version of the test clock signal in accordance with a delay select signal.

6. A signal delay measurement circuit as recited in claim 5, wherein the delay select signal is controllable such that the delayed version of the test clock signal can be set to correspond to a signal present at the output node of a particular delay element within the delay chain.

7. A signal delay measurement circuit as recited in claim 5, wherein the serially connected delay elements include a first coarse delay element followed by a number of fine delay elements.

8. A signal delay measurement circuit as recited in claim 1, wherein the signal delay measurement circuit is configured as a fine delay element calibration circuit having the emulation module defined as a coarse delay element and the delay chain defined to include a number of serially connected fine delay elements, an output node of each serially connected fine delay element connected to a respective input of a multiplexer, the multiplexer defined to pass through one of its inputs as the delayed version of the test clock signal in accordance with a delay select signal.

9. A delay element calibration circuit, comprising:
an input register defined to receive a test data signal and output the test data signal in accordance with a test clock signal, wherein a period of the test clock signal is adjustable;
an output register defined to receive a delayed version of the test data signal and output the delayed version of the test data signal in accordance with the test clock signal, the output register is directly coupled to the test clock signal; and
a chain of delay elements connected between an output of the input register and an input of the output register, the chain of delay elements defined to introduce signal delay in the test data signal as the test data signal is transmitted from the input register to arrive at the output register as the delayed version of the test data signal.

10. A delay element calibration circuit as recited in claim 9, wherein each of the input and output registers is defined as a flip-flop.

11. A delay element calibration circuit as recited in claim 9, wherein a total amount of signal delay to be introduced by the chain of delay elements represents a total amount of signal delay from an output port of the input register to an input port of the output register.

12. A delay element calibration circuit as recited in claim 9, wherein the chain of delay elements is defined to provide a total signal delay that is larger than a minimum achievable period of the test clock signal.

13. A delay element calibration circuit as recited in claim 9, wherein the chain of delay elements includes a number of serially connected delay elements, each of the number of serially connected delay elements defined to provide a substantially equivalent amount of signal delay.

14. A delay element calibration circuit as recited in claim 9, further comprising:
a phase lock loop circuit defined to generate the test clock signal, the phase lock loop circuit defined to enable discrete adjustment of the period of the test clock signal.

15. A delay element calibration circuit as recited in claim 9, wherein the period of the test clock signal is adjusted until the delayed version of the test data signal can be clocked into the output register.

16. A delay element calibration circuit as recited in claim 9, wherein a signal delay of each delay element is calculated using a count of delay elements and the period of the test clock signal in which the delayed version of the test data signal can be clocked through the output register.

17. A method of measuring a signal delay, comprising:
receiving a test data signal and a test clock signal at an input register;
emulating a signal delay of an actual signal transmission path to be measured using an emulation module; and
adjusting a signal delay in the test clock signal using a delay chain, wherein the signal delay of the emulated actual signal transmission path is calculated from the signal delay in the test clock signal when the delayed version of the test data signal from the input register is clocked through an output register.

18. The method of measuring a signal delay as recited in claim 17, further comprising:
increasing the signal delay of the test clock signal until the delayed version of the test data signal is clocked through an output register.

19. The method of measuring a signal delay as recited in claim 17, wherein the signal delay of the emulated actual signal path corresponds to the signal delay of either a data signal path or a data strobe signal path resulting in a delayed version of the test data signal.

20. The method of measuring a signal delay as recited in claim 17, further comprising:
transmitting a pair of reset pulses in the test clock signal; and
maintaining a low state on the test data signal, thereby clearing the contents of the input register and the output register.

* * * * *